(12) United States Patent
Jung

(10) Patent No.: US 7,700,468 B2
(45) Date of Patent: Apr. 20, 2010

(54) SEMICONDUCTOR DEVICE AND METHOD OF FABRICATING THE SAME

(75) Inventor: Ji Houn Jung, Jongno-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 260 days.

(21) Appl. No.: 11/835,071

(22) Filed: Aug. 7, 2007

(65) Prior Publication Data

US 2008/0029791 A1    Feb. 7, 2008

(30) Foreign Application Priority Data

Aug. 7, 2006   (KR)   ................ 10-2006-0074110

(51) Int. Cl.
*H01L 21/425*   (2006.01)

(52) U.S. Cl. .................. 438/524; 438/514; 438/529; 257/288; 257/E29.345

(58) Field of Classification Search ............... 438/514, 438/524, 529, 531; 257/288, E29.345, E21.473
See application file for complete search history.

(56) References Cited

U.S. PATENT DOCUMENTS

2008/0283926 A1*  11/2008  Sridhar .................. 257/369
2009/0020806 A1*   1/2009  Anderson et al. .......... 257/327

FOREIGN PATENT DOCUMENTS

KR   10-1998-0047082   6/2000

* cited by examiner

*Primary Examiner*—Phuc T Dang
(74) *Attorney, Agent, or Firm*—Saliwanchik, Lloyd & Saliwanchik

(57) ABSTRACT

Provided are a semiconductor device and a method of fabricating the semiconductor device. In the method, a field oxide layer can be formed in a semiconductor substrate so as to define and active electrode including a gate oxide layer and a gate poly is formed in the active region. An etch groove is formed between the gate electrode and the field oxide layer. Dopant ions are implanted between the gate electrode and the field oxide layer so as to form a source/drain region.

12 Claims, 4 Drawing Sheets

SEMICONDUCTOR DEVICE AND METHOD OF FABRICATING THE SAME

CROSS-REFERENCE TO RELATED APPLICATION

The present application claims the benefit under 35 U.S.C. §119 of Korean Patent Application No. 10-2006-0074110, filed Aug. 7, 2006, which is hereby incorporated by reference in its entirety.

BACKGROUND

A metal oxide semiconductor (MOS) transistor includes source/drain regions formed in a semiconductor substrate, and an oxide layer and a gate poly formed on the semiconductor substrate.

The MOS transistor can be classified into an N type metal oxide semiconductor (NMOS) transistor or a P type metal oxide semiconductor (PMOS) transistor according to channel type. A complementary metal oxide semiconductor (CMOS) transistor includes an NMOS transistor and a PMOS transistor formed on the same substrate.

The CMOS transistor is used to form a circuit requiring a pair of PMOS and NMOS transistors, such as an inverter and a flip-flop circuit.

Recent MOS transistors have fine dimensions so as to satisfy the need of high-performance and highly-integrated devices. However, since a power voltage to the MOS transistor is not changed, the intensity of an electric field in the MOS transistor is high. That is, since the current MOS transistors have a narrow gate, an electric field is concentrated onto a drain. As a result of the electric field concentration, carriers of a depletion layer adjacent to the drain receive energy from the intensive electric field, and thus undesired effects such as a hot carrier effect occur.

Therefore, a CMOS transistor having a lightly doped drain (LDD) structure is introduced to prevent the hot carrier effect. The LDD type CMOS transistor includes lightly and gradually doped source/drain regions formed between a drain and a channel.

Owing to the LDD structure, the intensity of an electric field can be reduced, and the electric field can be distributed in a drain direction so as to reduce an undesired current in a substrate and deterioration of a device.

However, many processes such as the LDD region forming process, a cleaning process, a process of forming a cap oxide layer, and a process of forming lateral spacers are required to form the LDD structure in which lightly and gradually doped source/drain regions are formed between a drain and a channel to prevent the hot carrier effect.

BRIEF SUMMARY

Embodiments of the present invention provide a semiconductor device having an improved structure replacing a lightly doped drain (LDD) structure for inhibiting a hot carrier effect and effectively controlling a breakdown voltage, and a method of fabricating the semiconductor device.

In one embodiment, there is provided a method of fabricating a semiconductor device, the method including: forming a field oxide layer in a semiconductor substrate so as to define an active region; forming a gate electrode in the active region, the gate electrode including a gate oxide layer and a gate poly; forming an etch groove between the gate electrode and the field oxide layer; and implanting dopant ions between the gate electrode and the field oxide layer so as to form a source/drain region.

In another embodiment, there is provided a semiconductor device including: a field oxide layer defining an active region in a semiconductor substrate; a gate electrode in the active region; an etch groove between the gate electrode and the field oxide layer; and a source/drain region in the active region.

In further another embodiment, there is provided a method of fabricating a semiconductor device, the method includes: forming a field oxide layer in a semiconductor substrate so as to define an active region; selectively implanting dopant ions into the active region so as to form a P type metal oxide semiconductor (PMOS) transistor region and an N type metal oxide semiconductor (NMOS) transistor region; forming a gate electrode in each of the P and N type metal oxide semiconductor transistor regions; forming an etch groove between each of the gate electrodes and the field oxide layer; and implanting dopant ions between the gate electrode and the field oxide layer so as to form a source/drain region.

The details of one or more embodiments are set forth in the accompanying drawings and the description below. Other features will be apparent from the description and drawings, and from the claims.

DETAILED DESCRIPTION

A semiconductor device and a method of fabricating the semiconductor device according to embodiments of the present invention will now be described in detail with reference to the accompanying drawings.

In embodiments, a complementary metal oxide semiconductor (CMOS) transistor and a method of fabricating the CMOS transistor are described. The CMOS transistor includes an N type metal oxide semiconductor (NMOS) transistor and a P type metal oxide semiconductor (PMOS) transistor. The CMOS transistor can be used to form a predetermined circuit.

Although a method of fabricating a CMOS transistor is described in the embodiment, the method can be used for forming other transistors.

Figure 1:
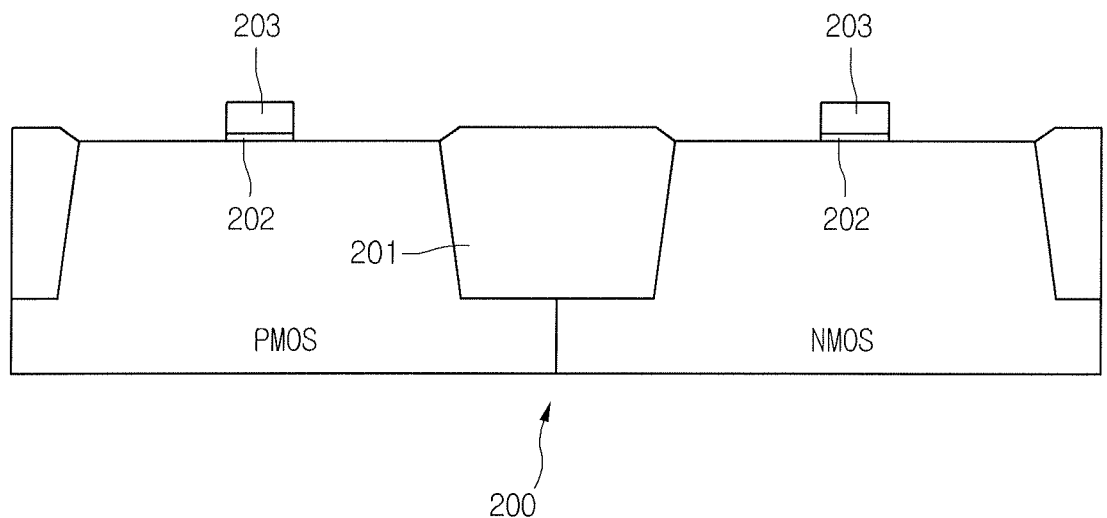
FIGS. 1 to 6 are views illustrating a semiconductor device and a method of fabricating the semiconductor device according to embodiments.

Referring to FIG. 1, a field oxide layer 201 is formed in a semiconductor substrate 200 using, for example, a local oxidation of silicon (LOCOS) process or a shallow trench isolation (STI) process so as to define active regions in which semiconductor devices will be formed.

The semiconductor substrate 200 may be a first conductive type semiconductor substrate or a second conductive type semiconductor substrate. For example, the first conductive type semiconductor substrate can be an N type semiconductor substrate, and the second conductive type semiconductor substrate can be a P type semiconductor substrate.

Next, dopant ions can be selectively implanted into the active regions through a twin well forming process so as to form a P well and an N well in the active regions, respectively. The P well forms a PMOS transistor region, and the N well forms an NMOS transistor region.

Next, a gate oxide layer 202 can be formed in the PMOS and NMOS transistor regions by growing an oxide layer through a thermal oxidation process. In an embodiment, the oxide layer can be grown to a thickness of about 100 Å. Then, a polysilicon layer can be deposited on the oxide layer.

Thereafter, the polysilicon layer and the oxide layer can be patterned to form gate electrodes each including the gate oxide layer 202 and a gate poly 203.

The gate polys 203 are formed on the PMOS and NMOS transistor regions, respectively.

Figure 2:
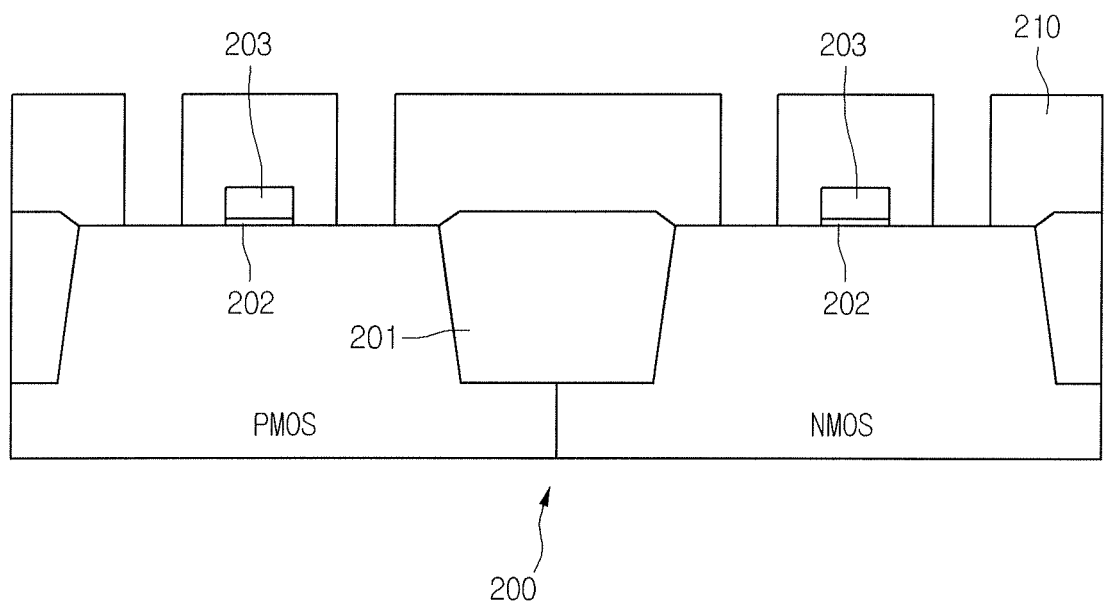
Figure 3:
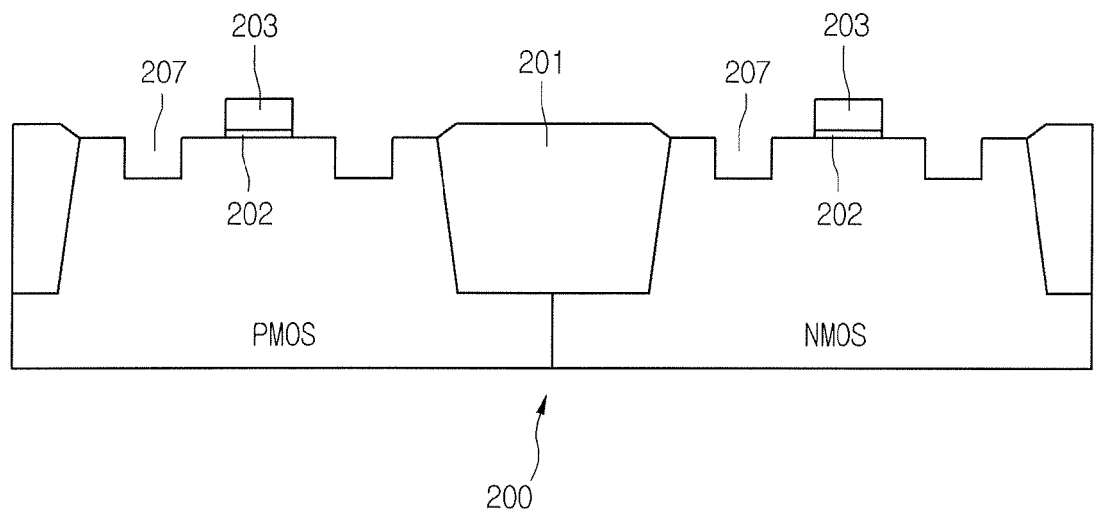

Referring to FIGS. 2 and 3, a mask pattern 210 is formed on the PMOS and NMOS transistor regions, and etch grooves 207 can be formed in the PMOS and NMOS transistor regions through an etch process.

The etch grooves 207 can be simultaneously formed in the PMOS and NMOS transistor regions.

In the current embodiment, a recess etch process is performed to form source/drain regions.

In detail, the recess etch process can be a dry etch process such as an anisotropic reactive ion etch process.

According to the related art, after a gate poly is formed, a cap oxide layer is formed on a semiconductor substrate including the gate poly. However, in the current embodiment, the formation of a cap oxide layer is optional.

Figure 4:
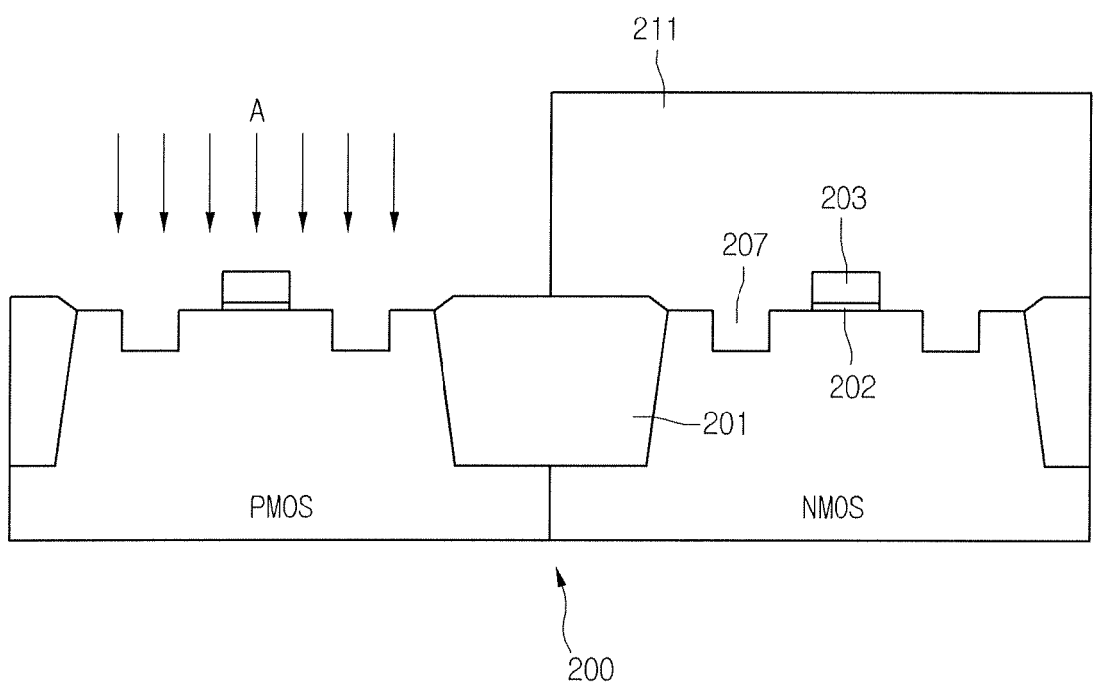

Referring to FIG. 4, a mask pattern 211 is formed to prevent dopant ions from being implanted into the NMOS transistor region.

Thereafter, N type dopant ions (A) are heavily implanted to form N type source/drain regions in the PMOS transistor region of the semiconductor substrate 200.

The mask pattern 211 covers a portion of the PMOS transistor region such that the N type dopant ions (A) can be heavily implanted into a desired area of the PMOS transistor region.

Figure 5:
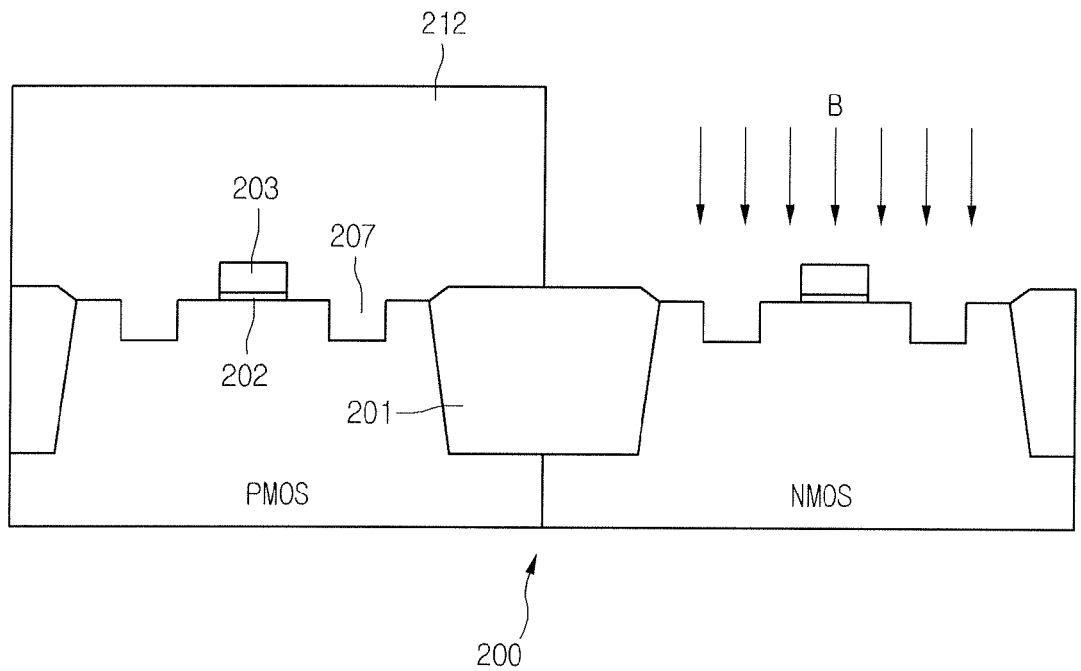

Referring to FIG. 5, the mask pattern 211 is removed from the NMOS transistor region. Then, a mask pattern 212 is formed on the PMOS transistor region to prevent dopant ions from being implanted into the PMOS transistor region.

After that, P type dopant ions (B) are heavily implanted to form P type source/drain regions in the NMOS transistor region of the semiconductor substrate 200.

The mask pattern 212 covers a portion of the NMOS transistor region such that the P type dopant ions (B) can be heavily implanted into a desired area of the NMOS transistor region.

Then, the mask pattern 212 is removed from the PMOS transistor region. The order of masking and implantation for PMOS and NMOS regions can be reversed such that dopant ions are implanted into the NMOS transistor region first, and then dopant ions are implanted into the PMOS transistor region.

The N type dopant ions (A) implanted into the PMOS transistor region may be arsenic (As) ions or phosphorus (P) ions.

The P type dopant ions (B) implanted into the NMOS transistor region may be boron (B) ions.

Figure 6:
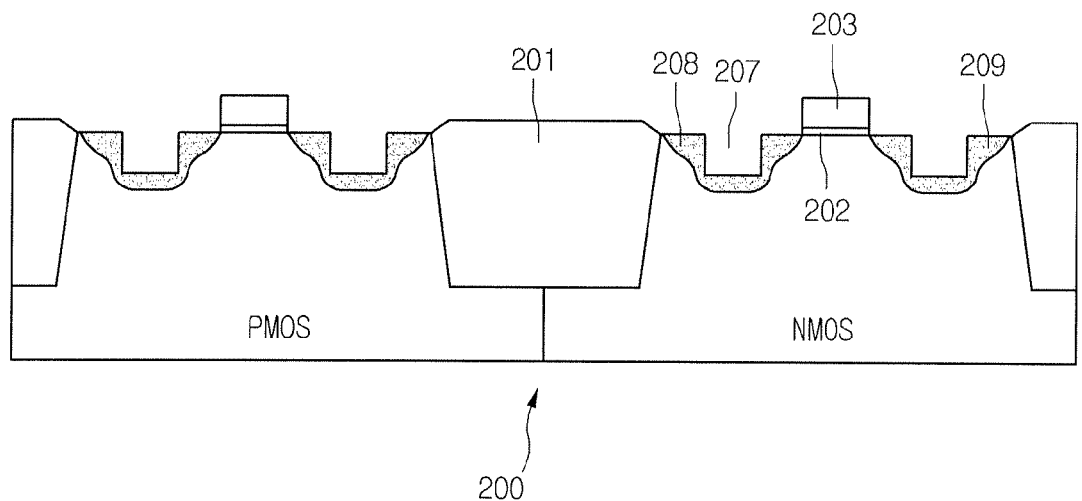

FIG. 6 is a view illustrating the CMOS transistor.

In each of NMOS and PMOS transistors, the etch grooves 207 are formed between the gate poly 203 and the field oxide layer 201, and then source and drain regions 208 and 209 are formed.

That is, in the current embodiment, the etch grooves 207 and the heavily doped dopant ions bring the same effects as LDD and source/drain regions of the related art.

In this way, the CMOS transistor including both PMOS and NMOS transistors is formed.

Thereafter, if necessary, additional processes can be performed to form an interlayer insulation layer and wiring lines.

Figure 7:
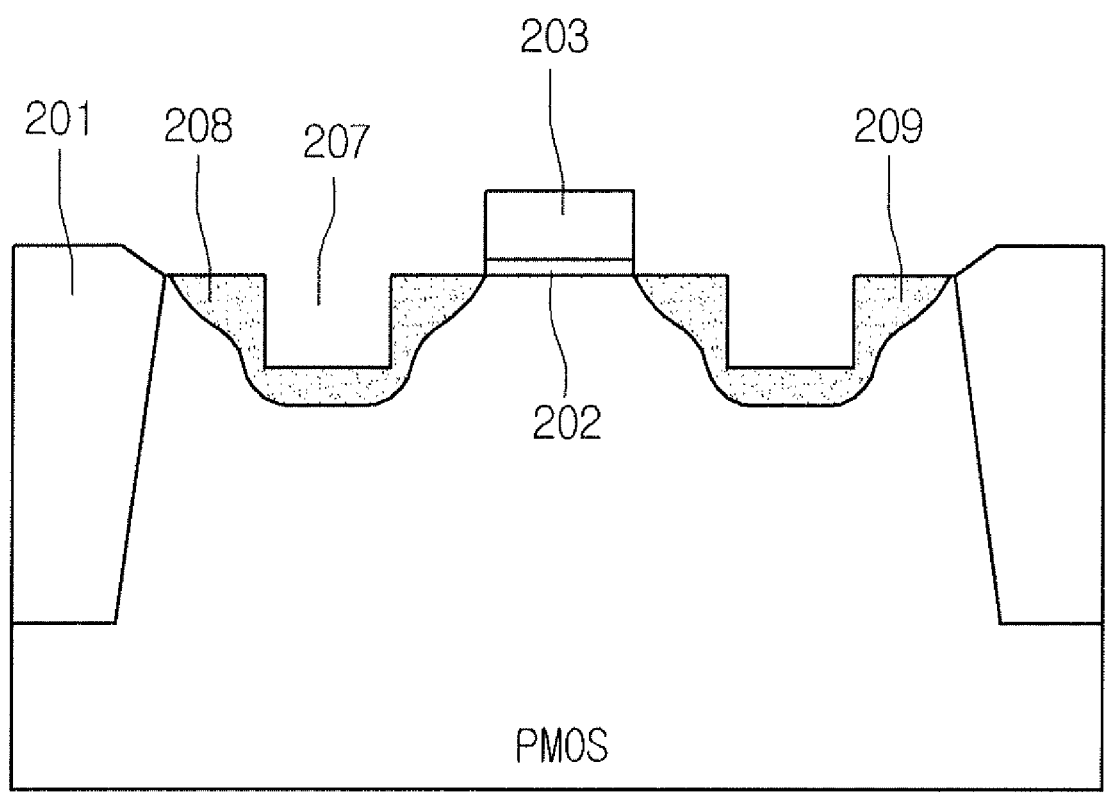
FIG. 7 is a view illustrating source/drain regions according to an embodiment.

FIG. 7 is a view illustrating an impurity region of the CMOS transistor according to an embodiment.

According to an embodiment, the etch grooves 207 and the source/drain regions 208 and 209 can be formed in the impurity region.

In the current embodiment, the impurity region includes the source/drain regions 208 and 209 having the same doping profiles as those of a related-art LDD region and source/drain regions formed by heavily implanting dopant ions using spacers as a mask. Therefore, undesired effects by an intensive electric field can be prevented.

Although the embodiments discuss a method of fabricating a CMOS transistor, the method can be used to fabricating other devices such as a MOS transistor.

As described above, according to the semiconductor device and the method of fabricating the semiconductor device of the embodiments, the hot carrier effect can be inhibited and a breakdown voltage can be effectively controlled by forming the etch grooves instead of forming an LDD structure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a semiconductor device, the method comprising:
    forming an etch groove between a gate electrode and a field oxide layer in a semiconductor substrate; and
    implanting dopant ions into the semiconductor substrate having the etch groove between the gate electrode and the field oxide layer so as to form a source/drain region,
    wherein forming the etch groove comprises performing a reactive ion etch process using a mask pattern exposing a region of the semiconductor substrate between the gate electrode and the field oxide layer.

2. The method according to claim 1, wherein the dopant ions are implanted into a predetermined region of the semiconductor substrate located between the gate electrode and the field oxide layer.

3. The method according to claim 1, wherein the source/drain region is formed by implanting the dopant ions in a single implantation process.

4. The method according to claim 1, wherein implanting dopant ions comprises implanting dopant ions at a high concentration into the semiconductor substrate having the etch groove.

5. The method according to claim 1, wherein the etch groove is formed by etching a region of the semiconductor substrate separated a distance from the gate electrode.

6. A method of fabricating a semiconductor device, the method comprising:
   forming a field oxide layer in a semiconductor substrate so as to define an active region;
   selectively implanting dopant ions into the active region so as to form a P type metal oxide semiconductor (PMOS) transistor region and an N type metal oxide semiconductor (NMOS) transistor region;
   forming a gate electrode in each of the P and N type metal oxide semiconductor transistor regions;
   forming an etch groove between each of the gate electrodes and the field oxide layer; and
   implanting dopant ions in the semiconductor substrate having the etch grooves so as to form a source/drain region,
   wherein the etch groove is formed by etching a region of the semiconductor substrate separated a distance from the gate electrode.

7. The method according to claim 6, wherein forming the gate electrode comprises:
   forming a gate oxide layer on the PMOS transistor region and the NMOS transistor region;
   depositing a polysilicon layer on the gate oxide layer; and
   patterning the polysilicon layer and the gale oxide layer.

8. The method according to claim 6, wherein forming an etch groove comprises performing a reactive ion etch process.

9. The method according to claim 6 wherein implanting the dopant ions comprises:
   implanting P type dopant ions into the NMOS transistor region using a mask pattern formed on the PMOS transistor region; and
   implanting N type dopant ions into the PMOS transistor region using a mask pattern formed on the NMOS transistor region.

10. The method according to claim 9, wherein implanting the P type dopant ions into the NMOS transistor region comprises implanting P type dopant ions into the semiconductor substrate having the etch groove in the NMOS transistor region at a high concentration; and
   wherein implanting the N type dopant ions into the PMOS transistor region comprises implanting N type dopant ions into the semiconductor substrate having the etch groove in the PMOS transistor region at a high concentration.

11. The method according to claim 9, wherein the source/drain regions are formed by implanting the P type dopant ions into the NMOS transistor region in a single implantation process and implanting the N type dopant ions into the PMOS transistor region in a single implantation process.

12. The method according to claim 6, wherein the etch groove is formed by an etch process with a mask pattern formed on the semiconductor substrate covering the gate electrode and the field oxide layer.

* * * * *